(12) United States Patent
Jang et al.

(10) Patent No.: US 8,188,650 B2
(45) Date of Patent: May 29, 2012

(54) METHOD FOR PREPARING MULTILAYER OF NANOCRYSTALS, AND ORGANIC-INORGANIC HYBRID ELECTROLUMINESCENCE DEVICE COMPRISING MULTILAYER OF NANOCRYSTALS PREPARED BY THE METHOD

(75) Inventors: Eun Joo Jang, Daejeon-Si (KR); Shin Ae Jun, Seongnam-Si (KR); Sung Hun Lee, Yongin-Si (KR); Jong Jin Park, Guri-Si (KR); Seong Jae Choi, Seoul (KR); Tae Kyung Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/432,180

(22) Filed: Apr. 29, 2009

(65) Prior Publication Data

US 2009/0236983 A1 Sep. 24, 2009

Related U.S. Application Data

(62) Division of application No. 11/002,461, filed on Dec. 3, 2004, now Pat. No. 7,569,248.

(30) Foreign Application Priority Data

May 28, 2004 (KR) .................................. 2004-38391

(51) Int. Cl.
*H01L 51/00* (2006.01)
*H05B 33/00* (2006.01)
(52) U.S. Cl. .......................... 313/504; 313/506; 428/690
(58) Field of Classification Search .................. 313/504, 313/509, 506; 428/690
See application file for complete search history.

(56) References Cited

U.S. PATENT DOCUMENTS

| 5,178,959 | A | 1/1993 | Eckberg et al. |
| 5,537,000 | A | 7/1996 | Alivisatos |
| 5,751,018 | A | 5/1998 | Alivisatos |
| 6,049,090 | A | 4/2000 | Clark |
| 6,159,620 | A | 12/2000 | Heath |
| 6,259,506 | B1 | 7/2001 | Lawandy |
| 6,608,439 | B1 | 8/2003 | Sokolik |
| 6,805,904 | B2 | 10/2004 | Anders et al. |
| 7,199,393 | B2 | 4/2007 | Park |
| 2003/0059647 | A1* | 3/2003 | Thompson et al. ........... 428/690 |
| 2005/0008880 | A1 | 1/2005 | Kunze |
| 2005/0054004 | A1* | 3/2005 | Alivisatos et al. ............. 435/7.1 |
| 2005/0117868 | A1 | 6/2005 | Chen |
| 2005/0161666 | A1* | 7/2005 | Park et al. ........................ 257/40 |

FOREIGN PATENT DOCUMENTS

JP 2003217861 A 7/2003

(Continued)

*Primary Examiner* — Karabi Guharay
(74) *Attorney, Agent, or Firm* — Cantor Colburn LLP

(57) ABSTRACT

A method for preparing a multilayer of nanocrystals. The method includes the steps of (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals, and (ii) repeating the procedure of step (i) to form one or more monolayers of nanocrystals on the first monolayer of nanocrystals. Further, an organic-inorganic hybrid electroluminescence device using a multilayer of nanocrystals prepared by the method as a luminescent layer. The luminescent efficiency and luminescence intensity of the electroluminescence device can be enhanced, and the electrical properties of the electroluminescence device can be controlled by the use of the multilayer of nanocrystals as a luminescent layer.

11 Claims, 3 Drawing Sheets

FOREIGN PATENT DOCUMENTS

| | | |
|---|---|---|
| JP | 2004095549 A | 3/2004 |
| JP | 2004134395 A | 4/2004 |
| KR | 10-2004-0059588 | 7/2004 |
| WO | 0017655 A1 | 3/2000 |
| WO | 0196454 A1 | 12/2001 |
| WO | 03/084292 | 10/2003 |
| WO | 03084292 A1 | 10/2003 |
| WO | 2004034421 A2 | 4/2004 |

* cited by examiner

METHOD FOR PREPARING MULTILAYER OF NANOCRYSTALS, AND ORGANIC-INORGANIC HYBRID ELECTROLUMINESCENCE DEVICE COMPRISING MULTILAYER OF NANOCRYSTALS PREPARED BY THE METHOD

This non-provisional application claims priority under 35 U.S.C. 119(a) on Korean Patent Application No. 2004-38391 filed on May 28, 2004, which is herein expressly incorporated by reference.

BACKGROUND OF THE INVENTION

1. Field of the Invention

The present invention relates to a method for preparing a multilayer of nanocrystals, and an organic-inorganic hybrid electroluminescence device comprising a multilayer of nanocrystals prepared by the method. More particularly, the present invention relates to a method for preparing a multilayer of nanocrystals by (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals, and (ii) repeating the procedure of (i) to form one or more monolayers of nanocrystals on the first monolayer of nanocrystals; and an organic-inorganic hybrid electroluminescence device using the multilayer of nanocrystals prepared by the method, as a luminescent layer. The use of the multilayer of nanocrystals as a luminescent layer can enhance luminescent efficiency and luminescence intensity of the electroluminescence device, and can control electrical properties of the electroluminescence device.

2. Description of the Related Art

A nanocrystal is defined to be a material having a crystal size at the nanometer-scale level, and consists of a few hundred to a few thousand atoms. Since the nanocrystal has a large surface area per unit volume, most of the atoms constituting the nanocrystal are present at the surface of the nanocrystal. Based on this structure, the nanocrystal exhibits quantum confinement effects, and shows electrical, magnetic, optical, chemical and mechanical properties different from those inherent to the constituent atoms of the nanocrystal. That is, the control over the physical size of the nanocrystal enables the control of various properties.

Vapor deposition processes, such as metal organic chemical vapor deposition (MOCVD) and molecular beam epitaxy (MBE), have been conventionally used to prepare nanocrystals. On the other hand, a wet chemistry technique wherein a precursor material is added to an organic solvent to grow nanocrystals to a desired size has made remarkable progress in the past decade. According to the wet chemistry technique, as the crystals are grown, the organic solvent is naturally coordinated to the surface of the quantum dot crystals and acts as a dispersant. Accordingly, the organic solvent allows the crystals to grow to the nanometer-scale level. The wet chemistry technique has an advantage in that nanocrystals can be uniformly prepared in size and shape in a relatively simple manner at low cost, compared to conventional vapor deposition processes, e.g., MOCVD and MBE. However, since nanocrystals prepared by the wet chemistry technique are commonly dispersed in an organic solvent, techniques for forming a thin film of the nanocrystals are required in order to apply the nanocrystals to electronic devices.

Conventionally, a self-assembly process has been mainly used to form a thin film of nanocrystals prepared by the wet chemistry technique. For example, U.S. Pat. No. 5,751,018 discloses a method for attaching semiconductor nanocrystals to solid inorganic surfaces, using self-assembled bifunctional organic monolayers as bridge compounds. Further, Korean Patent Application No. 2002-85262 discloses a method for preparing a multilayer of nanocrystals by bonding a dithiol group to the surface of nanocrystals to form disulfide bonds between the nanocrystals. Further, a method is disclosed for preparing a multilayer of nanocrystals by charge-charge interaction. According to this method, nanocrystals surface-substituted with a charged compound are bound to an oppositely charged substrate to form a thin film of the nanocrystals, an organic compound oppositely charged to the nanocrystals is bound on the thin film, and then the above procedure is repeated.

However, these methods for forming a thin film of nanocrystals by self-assembly have a problem that they involve an additional step of treating the surface of nanocrystals and a substrate with a compound containing a specific functional group, rendering the overall procedure more complex.

Meanwhile, electroluminescence devices using nanocrystals as a luminescent layer are described in U.S. Pat. Nos. 5,537,000, 6,608,439 and 6,049,090, and PCT publication WO 03/084292.

U.S. Pat. No. 5,537,000 describes an electroluminescence device without an organic electron transport layer in which a multilayer of nanocrystals acts as both a luminescent layer and an electron transport layer, and the wavelengths of emitted light are dependent on a voltage applied to the device. However, the patent publication simply describes that the multilayer of nanocrystals can be prepared by the use of a self-assembly process mentioned in U.S. Pat. No. 5,751,018, but fails to specifically describe a process for forming a monolayer of nanocrystals or preparing a multilayer of nanocrystals using the monolayer.

PCT publication WO 03/084292 describes an organic-inorganic luminescence device which comprises a matrix containing a large number of nanocrystals and disposed between two electrodes. This patent publication also suggests a method for enhancing electroluminescent performance of the device by spin-coating a mixture of nanocrystals and a low-molecular weight hole transporting material (e.g., N,N'-diphenyl-N,N'-bis(3-methylphenyl)-(1,1'-biphenyl)4,4'-diamine (TPD)) on an electrode, and introducing an organic electron transport layer and electron/hole blocking layers into the device, thereby allowing the organic layer to transport electrons and holes and allowing the nanocrystals to emit light.

Further, U.S. Pat. No. 6,608,439 discloses an integrated organic light emitting diode color display device in which nanocrystals used as a color-conversion layer absorb monochrome and short-wavelength light emitted from an organic layer, and then emit photoluminescence (PL) at a different wavelength. However, the luminescence device is not driven by electroluminescence.

Further, U.S. Pat. No. 6,049,090 describes a device using a mixed layer of nanocrystals-matrix as a luminescent layer disposed between two electrodes wherein the band gap energy and the conduction band energy level of the matrix are more than those of the nanocrystals. The patent publication also explains that since electrons and holes are trapped by the matrix, the luminescent efficiency of the device can be enhanced.

As described above, there are few reports on the preparation of a multilayer of nanocrystals used as a luminescent layer in order to enhance the luminescent efficiency of electroluminescence devices, except for the self-assembly process involving complicated steps.

OBJECTS AND SUMMARY

Thus, the present inventors have earnestly and intensively conducted research to solve the problems of conventional methods for preparing a multilayer of nanocrystals in terms of complicated procedures. As a result, the present inventors have found that when nanocrystals surface-coordinated by a photosensitive compound are coated on a substrate and exposed to UV light, a crosslinking reaction takes place between photosensitive functional groups of the photosensitive compound to form a network structure, resulting in the formation of a monolayer of nanocrystals insoluble in solvents, and further the preparation of a multilayer of nanocrystals in a relatively simple manner when compared to prior art methods. The present invention is based on this finding.

Therefore, it is an object of the present invention to provide a method for preparing a multilayer of nanocrystals in a simple manner, without the need for a complicated process, such as self-assembly of nanocrystals.

It is another object of the present invention to provide a method for preparing a multilayer of nanocrystals-polymer by utilizing the method for preparing a multilayer of nanocrystals.

It is yet another object of the present invention to provide an electroluminescence device with enhanced luminescent efficiency using a multilayer of nanocrystals or a multilayer of nanocrystals-polymer prepared by any one methods of the present invention, as a luminescent layer.

In accordance with one aspect of the present invention, the above objects can be accomplished by a method for preparing a multilayer of nanocrystals comprising the steps of: (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals; and (ii) repeating the procedure of step (i) to form one or more monolayers of nanocrystals on the first monolayer of nanocrystals.

In accordance with another aspect of the present invention, there is provided a method for preparing a multilayer of nanocrystals-polymer comprising the steps of: (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals; (ii) forming a first polymer monolayer on the first monolayer of nanocrystals; and (iii) repeating the procedure of step (i) and/or step (ii) to form one or more monolayers of nanocrystals and/or one or more polymer monolayers on the first polymer monolayer.

In accordance with yet another aspect of the present invention, there is provided an organic-inorganic hybrid electroluminescence device using a multilayer of nanocrystals or a multilayer of nanocrystals-polymer prepared by any one methods of the present invention, as a luminescent layer disposed between a pair of electrodes.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Embodiments of the present invention will now be described in more detail with reference to the accompanying drawings.

Preparation of Multilayer of Nanocrystals

First, nanocrystals surface-coordinated by a photosensitive compound, or a mixed solution of a photosensitive compound and nanocrystals surface-coordinated by a material miscible with the photosensitive compound is coated on a substrate, dried, and then exposed to UV light to form a first monolayer of nanocrystals. Thereafter, the above procedure is repeated to form one or more monolayers of nanocrystals on the first monolayer of nanocrystals, thereby preparing a multilayer of nanocrystals. In the method of the present invention, the nanocrystals are prepared by a wet chemistry technique, and the surface of the nanocrystals is coordinated by an appropriate dispersant in order to minimize agglomeration between the nanocrystals and prevent precipitation of the agglomerated nanocrystals.

In this manner, when the nanocrystals surface-coordinated by the photosensitive compound are coated on a substrate and exposed to a high-energy light source, such as UV light, a crosslinking reaction takes place between photosensitive functional groups of the photosensitive compound. This crosslinking reaction enables the formation of a network structure of the nanocrystals, resulting in the formation of a monolayer of nanocrystals insoluble in solvents.

Figure 1:
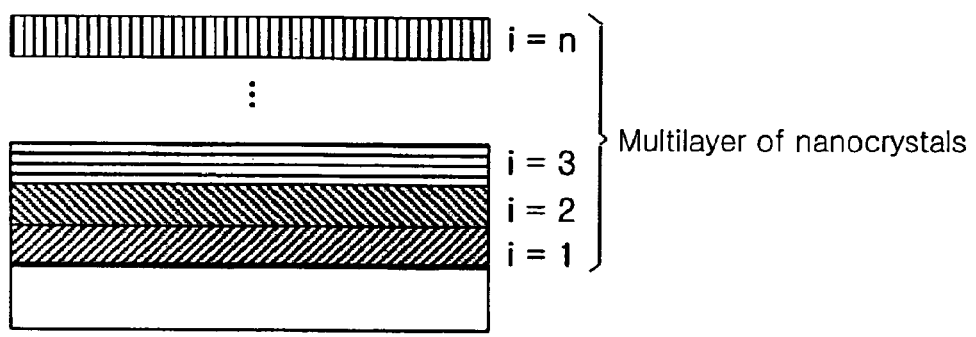
FIG. 1 is a schematic view showing the structure of a multilayer of nanocrystals prepared by a method of the present invention.

On the other hand, when a uniformly mixed solution of a photosensitive compound and nanocrystals surface-coordinated by a dispersant containing no photosensitive functional group but miscible with the photosensitive compound is coated on a substrate and exposed to a high-energy light source, such as UV light, a crosslinking reaction takes place between photosensitive functional groups of the photosensitive compound. This crosslinking reaction enables the inclusion of the nanocrystals in a network structure, resulting in the formation of a first monolayer of nanocrystals insoluble in solvents. Thereafter, the above procedure is repeated to form one or more monolayers of nanocrystals on the first monolayer, thereby preparing a multilayer of nanocrystals. The structure of the multilayer of nanocrystals is schematically shown in FIG. 1.

Nanocrystals usable in the present invention may include all nanocrystals prepared from metal precursors by a wet chemistry technique. For example, the nanocrystals may be prepared by adding a corresponding metal precursor to an organic solvent in the absence or presence of a dispersant, and growing crystals at a predetermined temperature.

That is, nanocrystals usable in the present invention include most of the nanocrystals prepared by a wet chemistry technique, such as metal nanocrystals and semiconductor nanocrystals. As suitable nanocrystals, there may be mentioned, for example: metal nanocrystals, such as Au, Ag, Pt, Pd, Co, Cu, Fe, Al, Ni, Ir, Rh, Ru, and Mo; Group II-VI compound semiconductor nanocrystals, such as CdS, CdSe, CdTe, ZnS, ZnSe, ZnTe, HgS, HgSei and HgTe; and Group III-V compound semiconductor nanocrystals, such as GaN, GaP, GaAs, InP, InAs, InN, AlN, AlP, and AlAs; and Group IV-VI compound semiconductor PbS, PbSe, PbTe. As needed, there can be used a mixture of two or more nanocrystals, for example: nanoparticles in a simple mixture state of at least two nanocrystal compounds; fused crystals in which at least two compound crystals are partially present in the same crystal structure, e.g., core-shell structured crystals and gradient-structured crystals, and alloys of at least two nanocrystal compounds.

According to the method of the present invention, the monolayers constituting the multilayer of nanocrystals may be composed of one kind of nanocrystals, or two or more kinds of nanocrystals. That is, the multilayer of nanocrystals may have the same or different layer constitution.

The photosensitive compound coordinated to the surface of the nanocrystals is a compound wherein a photoreactive functional group (e.g., carbon-carbon double bond or acryl group) is selectively bonded to a linker (e.g., cyanide, thiol (SH), amino, carboxylic acid group or phosphonic acid group) through an alkylene, amide, phenylene, biphenylene, ester or ether group.

The nanocrystals surface-coordinated by the photosensitive compound can be prepared by obtaining nanocrystals from a corresponding metal precursor, dispersing the obtained nanocrystals in an organic solvent, and treating the dispersion with the photosensitive compound. The treatment with the photosensitive compound is not especially limited, but is preferably carried out by refluxing the dispersion of the nanocrystals in the presence of the photosensitive compound. The reflux conditions, including time and temperature, and the concentration of the photosensitive compound can be properly controlled according to the kind of the photosensitive compound coordinated to the surface of the nanocrystals, the dispersing solvent and the nanocrystals. For instance, nanocrystals are surface-coordinated by a dispersant (e.g., mercaptopropanol) having a reactive end group, and are then reacted with a photosensitive compound (e.g., methacryloyl chloride) capable of reacting with the reactive end group of the dispersant, thereby preparing nanocrystals surface-coordinated by the photosensitive compound.

Alternatively, nanocrystals directly surface-coordinated by a photosensitive compound may be prepared by adding a corresponding metal precursor to an organic solvent in the presence of the compound having a photosensitive functional group, and growing crystals at a predetermined temperature. The kind of the organic solvent, the crystal-growth temperature and the concentration of the precursor can be appropriately varied according to the kind of the photosensitive compound, and the kind, size and shape of the desired nanocrystals.

The coating of the nanocrystals on a substrate may be carried out by a spin coating, dip coating, spray coating or blade coating process, but is not especially limited thereto.

Considering the melting point of the solvent dispersing the nanocrystals, the drying of the coated substrate may be carried out at 20-300° C. and preferably 40-120° C. for complete removal of the solvent.

The exposure of the dried substrate may be carried out by a contact exposure or non-contact exposure process. In addition, the energy for photosensitization treatment is dependent on the thickness of the monolayer, and is preferably in the range of 50-850 mJ/cm$^2$. When the exposure energy is out of this range, a crosslinking reaction is not likely to take place, or there is a risk of damage to the monolayer. Considering absorption wavelength of the photosensitive group and crosslinking reaction conditions, light sources usable for the light exposure preferably have an energy in the range of 100-800 W at an effective wavelength of 200-500 nm and preferably 300-400 nm.

Preparation of Multilayer of Nanocrystals-Polymer

The present invention is also directed to a method for preparing a multilayer of nanocrystals-polymer. First, nanocrystals surface-coordinated by a photosensitive compound, or a mixed solution of a photosensitive compound and nanocrystals surface-coordinated by a material miscible with the photosensitive compound is coated on a substrate, dried, and exposed to UV light to form a first monolayer of nanocrystals (step (i)). Next, a first polymer monolayer is formed on the first monolayer of nanocrystals (step (ii)). Thereafter, step (i) and/or step (ii) are repeated to form one or more monolayers of nanocrystals and/or one or more polymer monolayers on the first polymer monolayer, thereby preparing a multilayer of nanocrystals-polymer.

Like the method for preparing a multilayer of nanocrystals, a first monolayer of nanocrystals is formed in step (i). Thereafter, a polymer monolayer is formed on the monolayer of nanocrystals. At this time, since the exposed monolayer of nanocrystals is highly stable in solvents, a monolayer composed of a polymer or a polymer precursor can be formed on the first monolayer of nanocrystals. Using a solvent causing no damage to the monolayer composed of a polymer or a polymer precursor, another monolayer of nanocrystals is formed on the monolayer composed of a polymer or a polymer precursor to prepare the final multilayer of nanocrystals-polymer.

Consequently, the multilayer of nanocrystals-polymer can be prepared by coating nanocrystals on a substrate, exposing the coated substrate to UV light to form a first monolayer of nanocrystals insoluble in solvents, forming a polymer monolayer on the first monolayer of nanocrystals, forming another monolayer of nanocrystals on the polymer thin film, and repeating the overall procedure. At this time, at least one kind of nanocrystal and at least one kind of polymer may be used. In addition, the multilayer of nanocrystals-polymer can be prepared by alternately layering the monolayer of nanocrystals and the polymer monolayer, or alternately layering several monolayers of nanocrystals and several polymer monolayers.

Fabrication of Organic-Inorganic Hybrid Electroluminescence Device Comprising Multilayer of Nanocrystals or Multilayer of Nanocrystals-Polymer The multilayer of nanocrystals or the multilayer of nanocrystals-polymer prepared by the method of the present invention is used as a luminescent layer of an organic-inorganic hybrid electroluminescence device.

Figure 2:
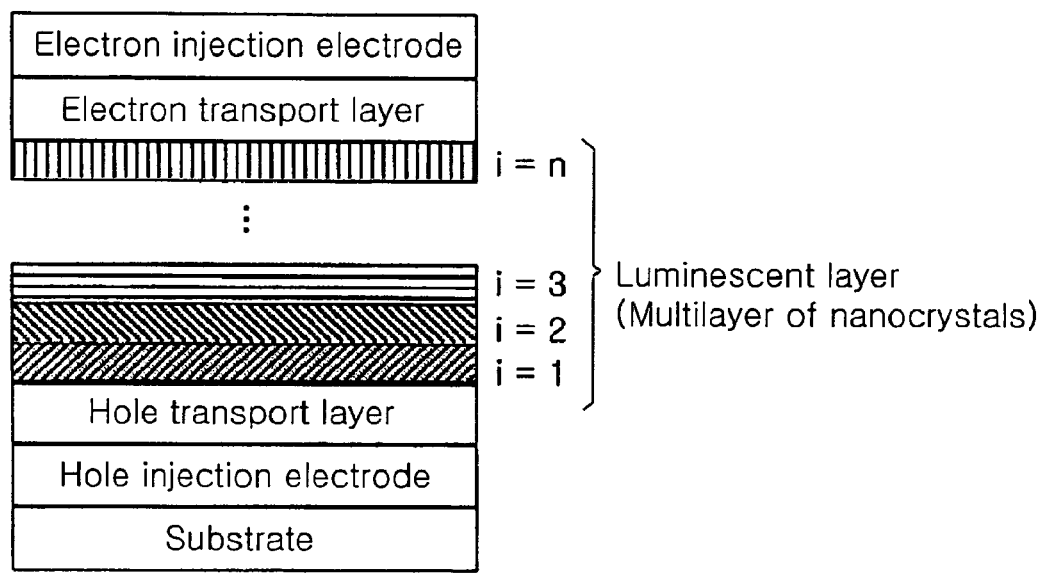
FIG. 2 is a schematic view showing the structure of an organic-inorganic hybrid electroluminescence device using a multilayer of nanocrystals prepared in accordance with one embodiment of the present invention, as a luminescent layer.

An organic-inorganic hybrid electroluminescence device according to one embodiment of the present invention is schematically shown in FIG. 2. As shown in FIG. 2, the multilayer of nanocrystals is used as a luminescent layer disposed between a pair of electrodes. Specifically, the organic-inorganic hybrid electroluminescence device comprises a substrate, a hole injection electrode, a hole transport layer, a luminescent layer (the multilayer of nanocrystals), an electron transport layer, and an electron injection electrode layered in this order from the bottom.

Figure 3:
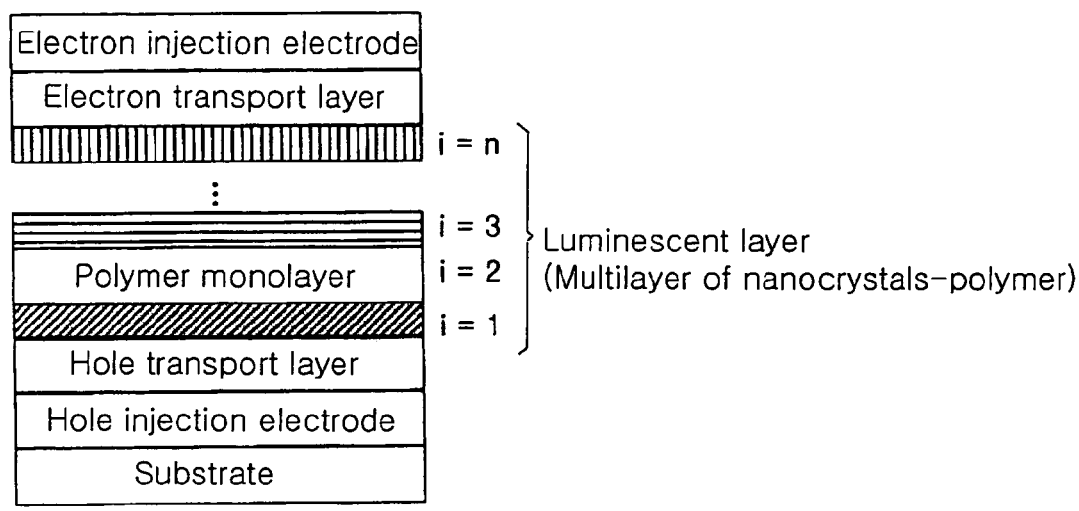
FIG. 3 is a schematic view showing the structure of an organic-inorganic hybrid electroluminescence device using a multilayer of nanocrystals-polymer prepared in accordance with another embodiment of the present invention, as a luminescent layer.

An organic-inorganic hybrid electroluminescence device according to one embodiment of the present invention is schematically shown in FIG. 3. As shown in FIG. 3, the multilayer of nanocrystals-polymer is used as a luminescent layer disposed between a pair of electrodes. Specifically, the organic-inorganic hybrid electroluminescence device comprises a substrate, a hole injection electrode, a hole transport layer, a luminescent layer (the multilayer of nanocrystals-polymer), an electron transport layer, and an electron injection electrode layered in this order from the bottom.

The organic-inorganic hybrid electroluminescence device of the present invention using the multilayer of nanocrystals or the multilayer of nanocrystals-polymer as a luminescent layer may further comprise an electron blocking layer and/or a hole blocking layer interposed between the luminescent layer and the hole transport layer or between the luminescent layer and the electron transport layer.

The organic-inorganic hybrid electroluminescence devices shown in FIGS. 2 and 3 are fabricated by a method comprising the steps of: (i) forming a hole injection electrode (anode) on a substrate; (ii) forming a hole transport layer (HTL) on the hole injection electrode; (iii) forming the multilayer of nanocrystals or the monolayer of nanocrystals-polymer prepared by the method of the present invention (i.e. a luminescent layer), on the hole transport layer; (iv) forming an electron transport layer (ETL) on the multilayer; and (v) forming an electron injection electrode (cathode) on the electron transport layer.

Examples of suitable substrates of the organic-inorganic hybrid electroluminescence device according to the present invention include those commonly used in the art of organic electroluminescence devices. A glass or transparent plastic substrate is preferably used in terms of superior transparency, superior surface smoothness, easy handling properties, and excellent waterproofness. Specific examples are preferably glass, polyethyleneterephthalate, and polycarbonate substrates. The thickness of the substrate is preferably in the range of 0.3-1.1 mm.

The hole injection electrode can be formed of a conductive metal or an oxide thereof, for example, indium tin oxide (ITO), indium zinc oxide (IZO), nickel (Ni), platinum (Pt), gold (Au), silver (Ag), or iridium (Ir). The substrate on which the electrode is formed is commonly washed with solvents, such as a neutral detergent, deionized water, acetone and isopropyl alcohol, and is then subjected to UV-ozone and plasma treatment.

As materials for the hole transport layer, polymeric materials causing no damage to the multilayer of nanocrystals or the multilayer of nanocrystals-polymer are preferably used. As the polymeric materials, there may be mentioned, for example, poly(3,4-ethylenedioxythiophene) (PEDOT)/polystyrene para-sulfonate (PSS), polytriphenylamine, polyphenylenevinylene and derivatives thereof, and polyfluorene and derivatives thereof. The thickness of the hole transport layer is preferably in the range of 10 to 100 nm.

The multilayer of nanocrystals or the multilayer of nanocrystals-polymer is prepared by the method of the present invention.

In order to prepare the multilayer of nanocrystals-polymer used as a luminescent layer of the organic-inorganic hybrid electroluminescence device according to the present invention, the polymer is preferably selected from materials capable of transporting holes and electrons or controlling the transportation rate. Examples of suitable polymers include poly(3,4-ethylenedioxythiophene) (PEDOT)/polystyrene para-sulfonate (PSS), polytriphenylamine, polyphenylenevinylene and derivatives thereof, polyfluorene, polyaniline, and polypyrrole and derivatives thereof. The formation of at least one polymer monolayer capable of transporting holes and electrons or controlling the transportation rate between monolayers of nanocrystals enables an active control in transportation of holes and electrons, allowing the monolayers of nanocrystals to emit light or enhancing the luminescent efficiency of the device.

Low- and high-molecular weight materials commonly used in the art can be used to form the electron transport layer, unlike the materials for the hole transport layer. As materials constituting the electron transport layer, there may be mentioned, for example, oxazoles, isooxazoles, triazoles, isothiazoles, oxydiazoles, thiadiazoles, perylenes, and aluminum complexes, including tris(8-hydroxyquinoline)-aluminum (Alq3), bis(2-methyl-8-quinolinolato)(p-phenyl-phenolato) aluminum (Balq) and bis(2-methyl-8-quinolinolato)(triphenylsiloxy) aluminum (III) (Salq). The thickness of the electron transport layer is preferably between 10 nm and 100 nm.

Examples of suitable materials for the electron blocking layer and/or the hole blocking layer include those commonly used in the art. Specific examples are 3-phenyl-4-(1'-naphthyl)-5-phenyl-1,2,4-triazole (TAZ), 2,9-dimethyl-1,10-phenanthroline (BCP), phenanthrolines, imidazoles, triazoles, oxadiazoles, and aluminum complexes. The thickness of the electron blocking layer and the hole blocking layer is preferably in the range of 5 nm to 50 nm.

As a material for the electron injection electrode, there can be used a metal having a low work function, such as I, Ca, Ba, Ca/Al, LiF/Ca, LiF/Al, $BaF_2$/Al, $BaF_2$/Ca/Al, Al, Mg, or a Ag—Mg alloy. The thickness of the electron injection electrode is preferably in the range of 50 nm to 300 nm.

The fabrication of the organic-inorganic hybrid electroluminescence device of the present invention does not require particular fabrication apparatuses and methods, except the formation of the luminescent layer. The organic-inorganic hybrid electroluminescence device of the present invention can be fabricated in accordance with conventional fabrication methods using common luminescent materials.

Hereinafter, the present invention will be specifically explained with reference to the following examples. However, these examples are given for the purpose of illustration and are not to be construed as limiting the scope of the invention.

PREPARATIVE EXAMPLE 1

Preparation of CdSes Nanocrystals Surface-Coordinated by Photosensitive Compound Containing Double Bond 16 g of trioctylamine, 0.5 g of oleic acid and 0.4 mmol of cadmium oxide were charged simultaneously into a 125 ml flask equipped with a reflux condenser. The temperature of the mixture was raised to 30° C. with stirring. Separately, a selenium (Se) powder was dissolved in trioctyl phosphine (hereinafter, referred to as TOP) to obtain an Se-TOP complex solution (Se concentration: about 0.25M), and a sulfur (S) powder was dissolved in TOP to obtain an S-TOP complex solution (S concentration: about 1.0M). 0.9 ml of the S-TOP complex solution and 0.1 ml of the Se-TOP complex solution were rapidly fed to the previous mixture, and then reacted for 4 minutes with stirring. After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant, 1 wt % of the precipitates were dispersed in toluene to prepare a dispersion of CdSeS nanocrystals. A luminescence peak in the photoluminescence spectrum of the nanocrystals was observed around 550 nm, and the nanocrystals emitted yellowish green light under a UV lamp at 365 nm.

EXAMPLE 1

Figure 4:
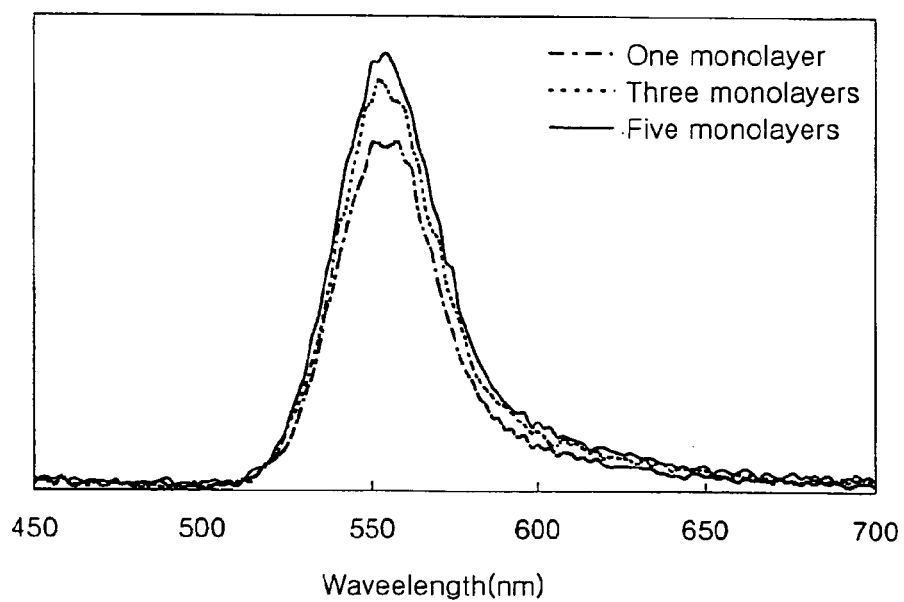
FIG. 4 shows photoluminescence spectra of a monolayer of nanocrystals and multilayers of nanocrystals, prepared in Example 1 of the present invention, according to increasing number (3 and 5) of the monolayers.

Preparation of Multilayer of CdSes Nanocrystals Surface-Coordinated by Photosensitive Compound After the toluene dispersion of CdSeS nanocrystals (1 wt %) prepared in Preparative Example 1 was dropped onto a glass substrate cleaned with isopropyl alcohol (IPA), spin coating was performed at 2,000 rpm for 30 seconds. The coated glass substrate was heated on a heating plate at 50° C. to form a monolayer of the nanocrystals. The monolayer was placed in a UV exposure system at an effective wavelength of 200-300 nm, and then UV light (800 W) was irradiated to the monolayer for about 300 seconds. The toluene dispersion of nanocrystals was dropped onto the UV-exposed monolayer, which was then spin-coated, dried and exposed to UV light under the same conditions as the previous formation procedure of the monolayer of nanocrystals. Thereafter, this procedure was repeated four times to prepare a multilayer (5-layer) of nanocrystals. FIG. 4 shows photoluminescence spectra of the multilayers of nanocrystals according to increasing number of the monolayers. As shown in FIG. 4, one luminescence peak in all the photoluminescence spectra was observed around 550 nm, and the luminescence intensity increased with increasing number of the monolayers. Further, the luminescence peak had a full width at half maximum ("FWHM") of approximately 36 nm.

EXAMPLE 2

Fabrication of Electroluminescence Device Comprising Multilayer of Nanocrystals-Polymer as Luminescent Layer An ITO-patterned glass substrate was sequentially washed with a neutral detergent, deionized water, acetone and isopropyl alcohol, and was then subjected to UV-ozone treatment. Poly(9,9'-dioctylfluorene-co-N-(4-butylphenyl)diphenylamine (TFB) was spin-coated on the substrate to form a hole transport layer having a thickness of 50 nm, and then baked. The toluene solution of CdSeS nanocrystals (1 wt %) prepared in Preparative Example 1 was spin-coated on the hole transport layer and dried to form a monolayer having a thickness of about 5 nm. After the monolayer was placed in a UV exposure system at an effective wavelength of 200-300 nm, UV (800 W) light was irradiated thereto for about 200 seconds. A solution of TFB was spin-coated on the exposed monolayer, and baked to obtain a polymer monolayer. The CdSeS nanocrystals were spin-coated on the polymer monolayer to prepare a multilayer of nanocrytals-polymer as a luminescent layer. (3-4-Biphenylyl)-4-phenyl-5-(4-tert-butylphenyl)-1,2,4-triazole (TAZ) was deposited on the luminescent layer to form a hole blocking layer, and then tris(8-hydroxyquinoline)-aluminum (Alq3) was deposited thereon to form an electron transport layer having a thickness of about 30 nm. LiF and aluminum were sequentially deposited on the electron transport layer to thicknesses of 1 nm and 200 nm, respectively, to fabricate an organic-inorganic hybrid electroluminescence device.

One luminescence peak in the electroluminescence spectrum of the organic-inorganic hybrid electroluminescence device was observed around 550 nm, and the FWHM was approximately 90 nm. In addition, the intensity of the peak was 73 $Cd/m^2$ and the luminescent efficiency was 0.32 Cd/A.

Figure 5:
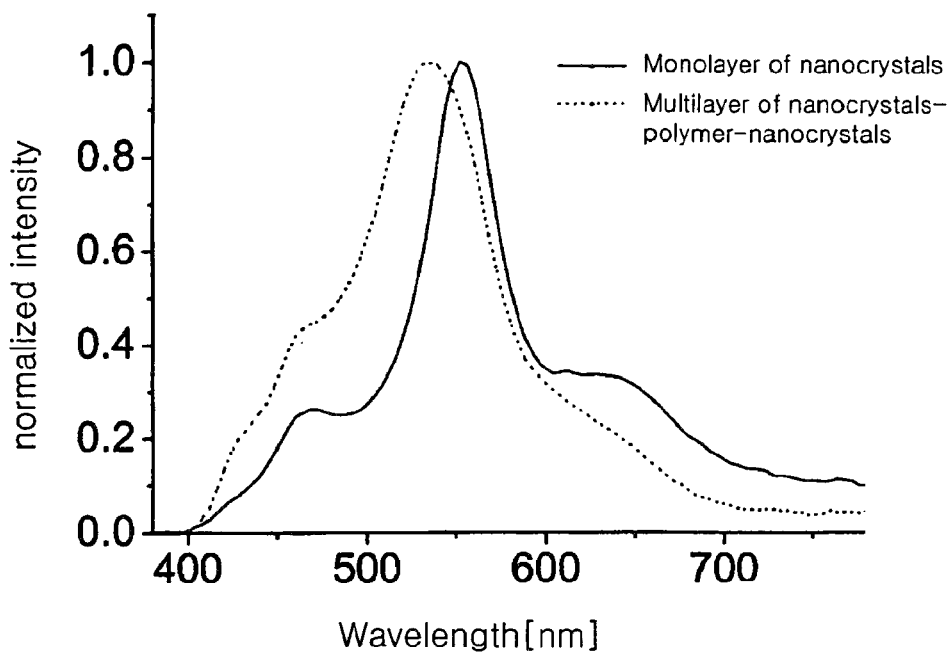
FIG. 5 shows electroluminescence spectra of an organic-inorganic hybrid electroluminescence device using a multilayer of nanocrystals-polymer as a luminescent layer, fabricated in Example 2 of the present invention, and an organic-inorganic hybrid electroluminescence device using a monolayer of nanocrystals as a luminescent layer.
Figure 6:
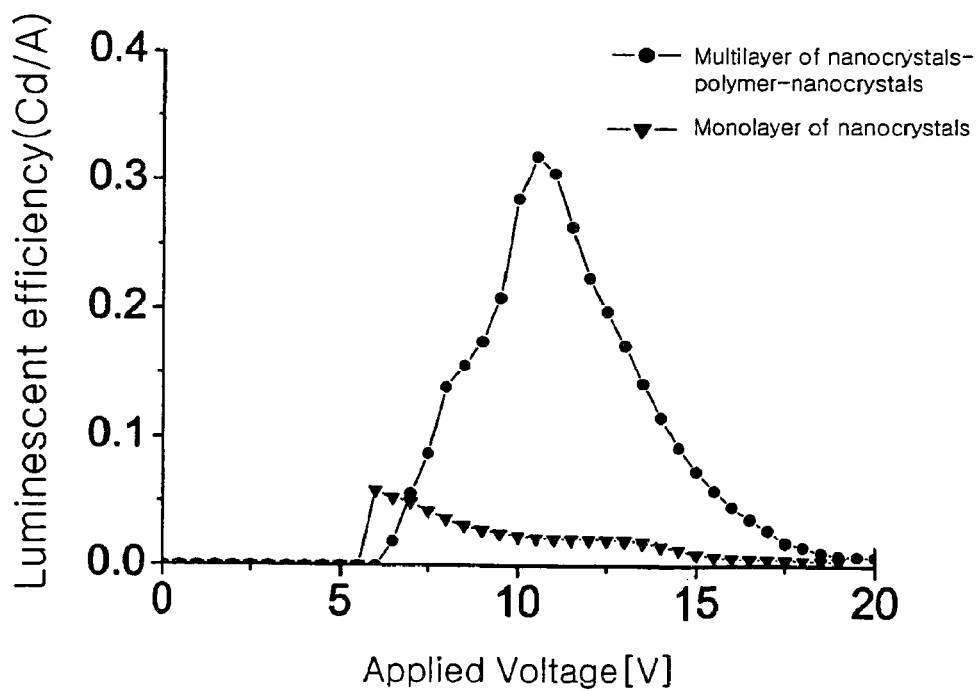
FIG. 6 is a graph showing the luminescent efficiency of an organic-inorganic hybrid electroluminescence device using a multilayer of nanocrystals-polymer as a luminescent layer, fabricated in Example 2 of the present invention, and an organic-inorganic hybrid electroluminescence device using a monolayer of nanocrystals as a luminescent layer.

FIG. 5 shows electroluminescence spectra of the organic-inorganic hybrid electroluminescence device using the multilayer of nanocrystals-polymer (TFB)-nanocrystals as a luminescent layer, fabricated in Example 2, and an organic-inorganic hybrid electroluminescence device using a monolayer of nanocrystals as a luminescent layer. FIG. 6 is a graph showing the luminescent efficiency of the organic-inorganic hybrid electroluminescence device using the multilayer of nanocrystals-polymer (TFB)-nanocrystals as a luminescent layer, fabricated in Example 2, and an organic-inorganic hybrid electroluminescence device using a monolayer of nanocrystals as a luminescent layer.

As shown in FIG. 5, the electroluminescence spectrum of the organic-inorganic hybrid electroluminescence device using the multilayer of nanocrystals-polymer-nanocrystals as a luminescent layer is similar to that of the organic-inorganic hybrid electroluminescence device using a monolayer of nanocrystals as a luminescent layer. However, it can be confirmed from FIG. 6 that the luminescent efficiency of the organic-inorganic hybrid electroluminescence device using the multilayer of nanocrystals-polymer-nanocrystals as a luminescent layer is 5.5 times that of the organic-inorganic hybrid electroluminescence device using a monolayer of nanocrystals as a luminescent layer.

As apparent from the foregoing, the use of the multilayer of nanocrystals or the multilayer of nanocrystals-polymer as a luminescent layer enables fabrication of an organic-inorganic hybrid electroluminescence device having enhanced luminescent efficiency and luminescence intensity. Particularly, the electrical properties of the electroluminescence device using the multilayer of nanocrystals-polymer as a luminescent layer can be controlled by the properties of the selected polymer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. An organic-inorganic hybrid electroluminescence device comprising:
   electrodes; and
   a luminescent layer disposed between the electrodes, the luminescent layer comprising at least one layer of nanocrystals coordinated with a photosensitive compound on a substrate, wherein the at least one layer of nanocrystals coordinated with the photosensitive compound are exposed to an ultraviolet light and form a solvent resistant, cross networked nanocrystal layer, wherein the photosensitive compound is a compound with a photoreactive functional group selectively bonded to a linker through an alkylene, amide, phenylene, biphenylene, ester, or ether group.

2. The organic-inorganic hybrid electroluminescence device according to claim 1, wherein the luminescent layer further comprises a polymer selected from the group consisting of poly(3,4-ethylenedioxythiophene) (PEDOT)/polystyrene para-sulfonate (PSS), polytriphenylamine, polyphenylenevinylene and derivatives thereof, and polyfluorene and derivatives thereof.

3. The organic-inorganic hybrid electroluminescence device according to claim 1, further comprising a substrate, a hole injection electrode, a hole transport layer, the luminescent layer, an electron transport layer, and an electron injection electrode layered in this order from the substrate.

4. The organic-inorganic hybrid electroluminescence device according to claim 3, further comprising an electron blocking layer, a hole blocking layer or an electron/hole blocking layer interposed between the luminescent layer and the hole transport layer or between the luminescent layer and the electron transport layer.

5. The organic-inorganic hybrid electroluminescence device according to claim 1, the luminescent layer comprises a multilayer of nanocrystals coordinated with a photosensitive compound.

6. The organic-inorganic hybrid electroluminescence device according to claim 1, wherein the linker is selected from the group consisting of cyanide, thiol (SH), amino, carboxylic acid group and phosphonic acid group.

7. The organic-inorganic hybrid electroluminescence device according to claim 1, photoreactive functional group comprises at least one of carbon-carbon double bond or an acryl group.

8. An organic-inorganic hybrid electroluminescence device comprising:
electrodes; and
a luminescent layer disposed between the electrodes, the luminescent layer comprising a multilayer of nanocrystals-polymer coordinated with a photosensitive compound on a substrate,
wherein the multilayer of nanocrystals-polymer coordinated with the photosensitive compound are exposed to an ultraviolet light such that the multilayer of nanocrystals-polymer coordinated with the photosensitive compound form a solvent resistant, cross networked nanocrystal layer and a solvent resistant polymer monolayer is disposed on the nanocrystal layer.

9. The organic-inorganic hybrid electroluminescence device according to claim 8, wherein the luminescent layer further comprises a polymer selected from the group consisting of poly(3,4-ethylenedioxythiophene) (PEDOT)/polystyrene para-sulfonate (PSS), polytriphenylamine, polyphenylenevinylene and derivatives thereof, and polyfluorene and derivatives thereof.

10. The organic-inorganic hybrid electroluminescence device according to claim 8, further comprising a substrate, a hole injection electrode, a hole transport layer, the luminescent layer, an electron transport layer, and an electron injection electrode layered in this order from the substrate.

11. The organic-inorganic hybrid electroluminescence device according to claim 8, further comprising an electron blocking layer, a hole blocking layer or an electron/hole blocking layer interposed between the luminescent layer and the hole transport layer or between the luminescent layer and the electron transport layer.

* * * * *